United States Patent
Andreev et al.

(10) Patent No.: US 7,856,577 B2
(45) Date of Patent: Dec. 21, 2010

(54) COMMAND LANGUAGE FOR MEMORY TESTING

(75) Inventors: Alexander E. Andreev, San Jose, CA (US); Anatoli A. Bolotov, Cupertino, CA (US); Ranko Scepanovic, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 462 days.

(21) Appl. No.: 11/944,104

(22) Filed: Nov. 21, 2007

(65) Prior Publication Data

US 2009/0133003 A1  May 21, 2009

(51) Int. Cl.
*G06F 11/00* (2006.01)

(52) U.S. Cl. .............. 714/42; 714/5; 714/25; 714/30

(58) Field of Classification Search .......... 714/5, 714/25, 27, 29, 30, 42
See application file for complete search history.

(56) References Cited

U.S. PATENT DOCUMENTS

| | | | | |
|---|---|---|---|---|
| 5,617,531 A | * | 4/1997 | Crouch et al. | 714/30 |
| 5,961,653 A | * | 10/1999 | Kalter et al. | 714/30 |
| 6,085,334 A | * | 7/2000 | Giles et al. | 714/30 |
| 6,353,563 B1 | * | 3/2002 | Hii et al. | 714/30 |
| 6,553,526 B1 | * | 4/2003 | Shephard, III | 714/733 |
| 6,634,003 B1 | | 10/2003 | Phan | 714/710 |
| 7,096,386 B2 | * | 8/2006 | Ozawa | 714/30 |
| 7,260,759 B1 | * | 8/2007 | Zarrineh et al. | 714/30 |
| 2002/0059543 A1 | * | 5/2002 | Cheng et al. | 714/30 |
| 2002/0129298 A1 | * | 9/2002 | Tamura | 714/30 |
| 2002/0178416 A1 | * | 11/2002 | Chen et al. | 714/30 |
| 2002/0194545 A1 | * | 12/2002 | Abbott | 714/42 |
| 2003/0023914 A1 | * | 1/2003 | Taylor et al. | 714/733 |
| 2005/0015671 A1 | * | 1/2005 | Parulkar et al. | 714/30 |
| 2005/0262401 A1 | * | 11/2005 | Saitou | 714/42 |
| 2005/0268159 A1 | * | 12/2005 | Tzeng | 714/5 |
| 2006/0212765 A1 | * | 9/2006 | Haufe | 714/724 |

* cited by examiner

*Primary Examiner*—Robert Beausoliel
*Assistant Examiner*—Joseph D Manoskey
(74) *Attorney, Agent, or Firm*—Cochran Freund & Young LLC

(57) ABSTRACT

A memory testing system for testing a plurality of memory locations in an electronic memory device is provided. The system includes a programmable memory device integrated into the electronic memory device capable of receiving and storing a compiled memory testing program. A processor is in communication with the programmable memory device to read and execute instructions from the compiled testing program stored in the programmable memory device and a command interpreter is configured to receive data from the processor related to commands to be executed during memory testing.

18 Claims, 3 Drawing Sheets

FIG. 2

Table 202:

| set_id (204) | com_id (206) | val (208) |
|---|---|---|
| 11 | 0000 | 1 | (210)
| 11 | 0000 | 0 | (212)
| 11 | 0001 | 1 | (214)
| 11 | 0001 | 0 | (216)

Table 220:

| set_id (222) | sel_flags (224) |
|---|---|
| 10 | 00001 | (226)
| 10 | 00010 | (228)

Table 230:

| set_id (232) | pars (234) |
|---|---|
| 00 | XXXXXX | (236)

302
```
int ini_arr[14] = { 0, 2, 2, 1, 1 };
int tar_arr[14] = { 2, 2, 1, 1, 2 };
int dir_arr[14] = { 1, 1, 1, 1, 1 };
int dim_arr[14] = { 0, 0, 0, 0, 0 };
// direction : 1 - up (0->last); 0 - down (last->0)
// dimension : 0 - along row; 1 - along column
set_enable_on
init_state = 0; target_state = 0; direction = 1; dimension = 0;
//active_port =0;
set_oracle_par(init_state, target_state, direction, dimension);
M = n("init_cycle", 0);
LOAD_JUMP(M);
```

304
```
LABEL(M);
W_MOVE_AND_JUMP_IF_0(M, init_state, F);
set_cmp_on;
LABEL("port_cycle");
set_enable_on;
```

306
```
for(i = 0; i < 5; i++)
{
  init_state = ini_arr[i]; target_state = tar_arr[i];
  direction = dir_arr[i]; dimension = dim_arr[i];
  set_oracle_par(init_state, target_state, direction, dimension);
  M = n("cycle", i);
  LOAD_JUMP(M);
  //memory test
  R(init_state)
  LABEL(M);
  W_MOVE(target_state, F);
  R_AND_JUMP_IF_0(M, init_state);
} set_enable_off;
change_active_port;
set_if_flag_to_last_port;
LOAD_JUMP("port_cycle");
JUMP_IF_0("port_cycle", 0);
send_done;
end_program;
```

FIG. 3

COMMAND LANGUAGE FOR MEMORY TESTING

FIELD OF THE DISCLOSURE

The present disclosure relates to memory devices and more particularly to the use of onboard computerized testing of memory devices.

BACKGROUND OF THE DISCLOSURE

As memory devices become more complex and achieve higher densities, it becomes increasingly important to provide comprehensive testing of such devices. It is well known that in very large scale integration (VLSI) integrated circuit designs, memory circuits have a much higher defect density than other logic. Because of the relatively higher defect density rate, memory circuits are commonly subjected to more and more comprehensive testing than other logic in VLSI designs.

One known testing method is to incorporate a built-in memory test controller onto the VLSI chip. Such built-in memory test controllers utilize corresponding memory test algorithms to test memory circuits. While such devices have utility, as designs become larger and more complex, comprehensive testing often requires a number of different tests be run on memory circuits. As a result, built-in memory test controllers can become cumbersome as different types of tests are combined into the built-in controller.

In view of the ever increasing demands for memory testing in ever increasing complexities in circuit chip design, what is needed is a way to perform memory testing that is efficient, flexible and has low complexity.

SUMMARY

In one illustrative embodiment, a memory testing system for testing a plurality of memory locations in an electronic memory device is discussed. The memory testing system includes a programmable memory device integrated into the electronic memory device capable of receiving and storing a compiled memory testing program. The testing system further includes a processor in communication with the programmable memory device to read and execute instructions from the compiled testing program stored in the programmable memory device and a command interpreter configured to receive data from the processor related to commands to be executed during memory testing.

In another embodiment, a command language for use with a memory testing system is discussed. The memory testing system includes a tangible memory storage device configured to store an indication of a memory program and a processor configured to access the memory storage device and executive instructions stored in the memory device for testing a plurality of memory locations on a memory device. The command language includes an instruction set including at least one command that, when executed, provides instruction to a command interpreter to access a memory location on the memory device.

In still another embodiment, a method of testing a plurality of memory locations in an electronic memory device located on an integrated circuit is discussed. The method includes preparing and compiling a memory testing algorithm that, when executed, accesses at least one of the plurality of memory locations in the electronic memory device. The method further includes storing the compiled memory testing algorithm on a programmable tangible storage medium located on the integrated circuit. The method still further includes accessing the compiled memory testing algorithm with a processor in communication with the tangible storage medium and executing the memory testing algorithm to test the plurality of memory locations.

BRIEF DESCRIPTION OF THE DRAWINGS

FIG. 2 is a diagram illustrating various configurations of data packets provided to the command interpreter of FIG. 1 for interpretation to test memory devices.

FIG. 3 is an example of a testing program for use with the testing system of FIG. 1.

DETAILED DESCRIPTION OF ILLUSTRATIVE EMBODIMENTS

Figure 1:
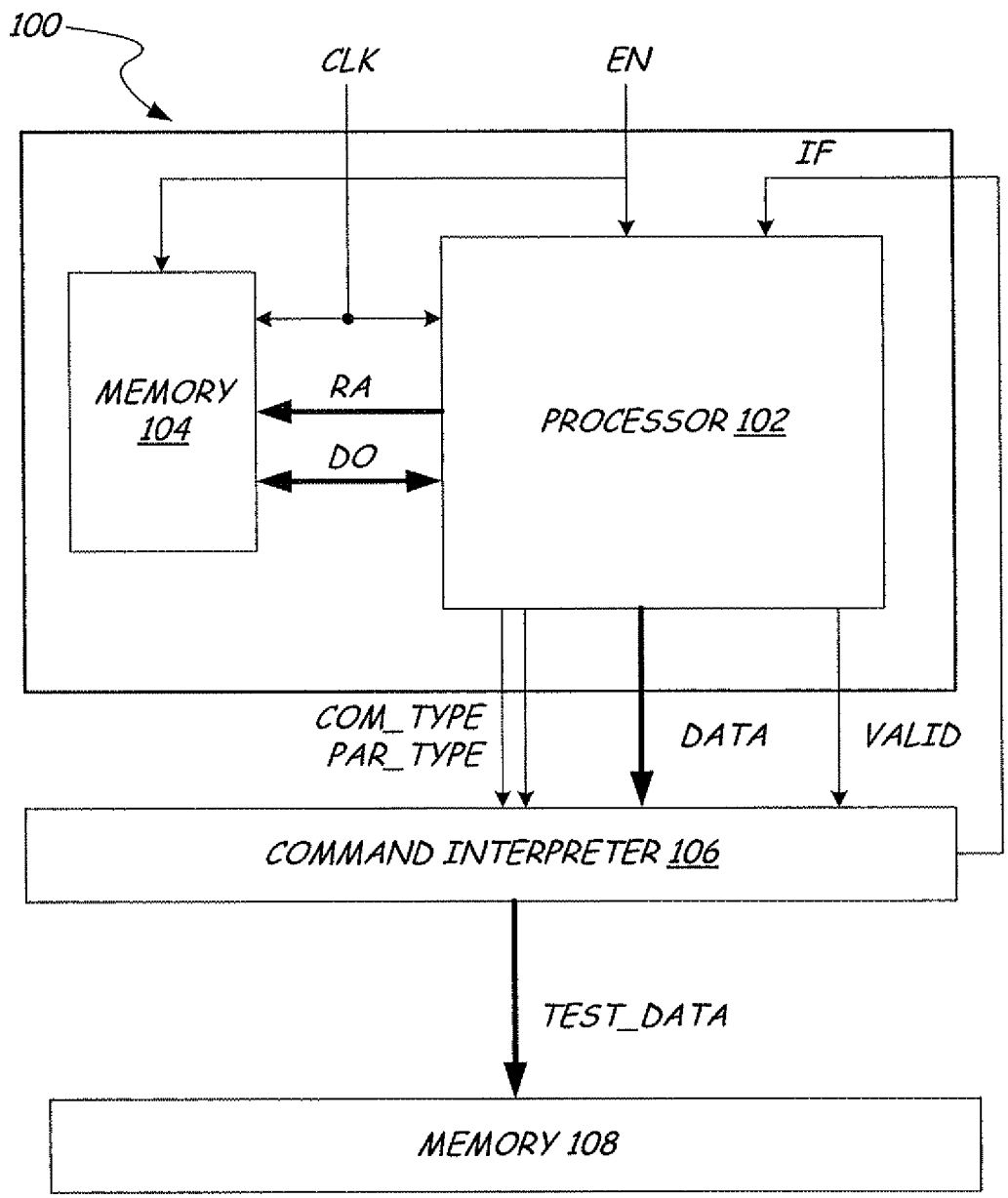
FIG. 1 is a block diagram illustrating a memory testing system for testing an electronic memory device according to one illustrative embodiment.

Memory testing systems and algorithms are designed to determine whether memory locations are functioning properly. For example, a memory testing system may perform tests on memory locations to determine whether a known data pattern can be written to memory locations and then successfully read from the memory locations. As discussed above, as memory devices become more complex, onboard testing devices become more complex and cumbersome. Thus, the embodiments discussed herein are directed toward memory testing systems with an internal memory that are capable of having memory testing programs downloaded into them. The memory testing programs can then be read and interpreted, that is to say, executed, by a program reader that is external to the memory allocated for the memory testing system. The program reader is independent of the internal memory and thus is limited only by the capacity of the internal memory.

There are a number of different types of applications in which memory testing of the type discussed here can be advantageous. One example of such an application is a system including a Memory Built-In Self Test (MBIST) chain that includes an MBIST controller and memory collars that are connected to the MBIST controller. Another example of an application for which the present embodiments are useful are Test Access Port (TAP) Controllers, which are advantageously used in factory programmable memory testing. Yet another example of an application that can utilize the memory testing systems described herein are Advanced RISC Machine (ARM) processors that are employed to control and test embedded devices with memories. Still another example of an advantageous application is a personal tester that employs, for example, a computing device with an input/output interface for accessing prototype circuit boards having memory devices that would benefit from memory testing. Thus, the memory testing systems described below are advantageously adapted to be implemented on any number of different testing frameworks. The embodiments discussed below are thus capable of being implemented across a number of systems are not intended to be limited to the particular frameworks discussed below.

FIG. 1 illustrates a memory testing system 100 according to one illustrative embodiment. The memory testing system 100 includes a processor 102 and a memory storage device 104. Memory storage device 104 includes memory locations for storage of a testing program. The processor 102 is in communication with the memory storage device 104 so that processor 102 can read and/or write data from and/or to the memory storage device 104. Address lines between the processor 102 and the memory storage device 104 are identified as RA while data lines between the processor 102 and the memory storage device 104 are identified as DO. It should be appreciated that there may be any number of each of the RA address lines and the DO data lines as necessary to pass the appropriate data and address information between the processor 102 and the memory storage device 104.

Memory storage device 104 can be any suitable type of memory storage. In one embodiment, the contents of memory storage device 104 can be rewritten to allow for the loading of any of a variety of testing programs that might be executed by the memory tester 100. Processor 102 is configured to access memory locations in memory storage device 104 to retrieve instructions and execute them. Testing programs that are loaded into the memory storage device 104 are precompiled so that at run time, the processor 102 merely accesses compiled commands and executes the program by executing the commands stored in the memory storage device 104. Examples of a command language to be used with the memory testing system 100 is described in more detail below. A clock line CLK is provided to each of the processor 102 and memory storage device 104 to control the rate at which commands are executed. In one embodiment, the processor 102 executes one command per clock cycle. An enable line EN is also provided to the processor 102 and the memory storage device 104. When the EN line is High, the processor 102 will retrieve and execute commands from the memory storage device 104.

The memory tester 100 also includes a command interpreter 106. The command interpreter 106 is illustratively coupled to the processor 102 and receives signals from the processor, with which it interprets various commands. The processor 102 provides information via one bit COM_TYPE and PA_TYPE lines, as well as via a plurality of DATA lines and a VALID status line. An IF line provided from the command interpreter 106 to the processor 102 provides status information to the processor 102 regarding the activities performed by the command interpreter 106. Command interpreter 106 is, in turn, in communication with memory 108, which is the memory to be tested. The COM_TYPE and PAR_TYPE lines provide information to the command interpreter 106 regarding how the information provided in the DATA lines should be interpreted. The VALID line is provided to the command interpreter to indicate that the information on the COM_TYPE, PAR_TYPE, and DATA lines are valid. The VALID line is illustratively equal to the EN input delayed by one clock cycle.

In one embodiment, the processor 102 is adapted to execute commands from a command language designed for memory testing. The execution of these commands directs the processor to provide information to the command interpreter 106 on the lines described above. Below are exemplary commands for an embodiment of a command language.

LABEL(L)

The LABEL(L) is an example of a non-executable command that associates a label L with a basic command following the label.

LOAD_JUMP(L)

The LOAD_JUMP command that illustratively includes a single parameter, L, which is a label that indicates a location in memory. The LOAD_JUMP command sets the active jump label to L. The LOAD_JUMP(L) sets the PAR_TYPE line High and the COM_TYPE line Low. No action is performed by the command interpreter 106 upon execution of the LOAD_JUMP command.

SEND_COM(DATA)

The SEND_COM(DATA) command is an unconditional command that is executed by the processor 102 after which the processor 102 moves to the next basic command to be executed. The SEND_COM command causes the processor 102 to set the PAR_TYPE line Low and the COM_TYPE line Low and provides data on the DATA lines to the command interpreter 106. The DATA parameter, in one embodiment, is a seven-bit binary vector, with all seven bits used in code by the command interpreter 106. The Low signals provided on each of the PAR_TYPE line and the COM_TYPE line, causes the command interpreter to parse the data provided by the DATA vector as follows:

DATA=(e, A_kod, we, d).

The e variable is one-bit wide and is reserved for extra editing as needed. A_kod is a two-bit wide command for an address shuttle, which can more forward (F), backward (B) or stay at the same memory address in the memory 108. Addresses generated by the address shuttle are expanded in the memory 108 to the actual memory addresses that are to be read from or written to. The we variable is a two bit wide write enable signal. The we signal is expanded to the WRITE ENABLE memory input signal in the memory 108. The d variable is two-bits of data that is expanded in the memory 108 into data to be written to, or alternatively, read from memory.

The described DATA is illustratively interpreted by the command interpreter 106, which in turn executes meta commands to access and test memory locations in memory 108. Below are listed some examples of the meta commands that the command interpreter 106 can execute along with a description of the commands. The command interpreter 106 distinguishes between these commands by the values provided in the DATA vector from the controller 102.

A R(val) command reads a two-bit value, val, from the current location in memory 108.

A W(val) command writes a two-bit value, val, to the current location in memory 108.

A W_MOVE(val,F) command writes a two-bit value, val, to the current location in memory 108 and moves forward to the next memory location as determined by the current memory route.

A R_AND_JUMP(L,val) command reads a two-bit value, val, from the current location in memory. If the value val=0, the program jumps to the command at label L. Otherwise, the program executes the next command in the program.

JUMP_IF_0(L,DATA)

The JUMP_IF_0(L,DATA) command is a conditional command that is executed by the processor 102. The JUMP_IF_0 command causes the processor 102 to set the PAR_TYPE line Low and the COM_TYPE line High and provides data on the DATA lines to the command interpreter 106. If, after the execution of the JUMP_IF_0 command the program control input IF=1, the processor 102 moves to the next basic command to be executed as does the SEND_COM command. If, however, the program control input IF=0, the processor 102 moves to the command pointed to by the label L. The JUMP_IF_0 command has two parameters: L, which is the label that points to a basic instruction and DATA, which is illustratively configured to be the same types of DATA passed to the command interpreter as described above related to the SEND_COM command. Thus, the JUMP_IF_0 illustratively is capable of instructing the command interpreter to perform the same types of commands (R(val), W(val), W_MOVE(val,F), and R_AND_JUMP(L,val)) as the SEND_COM command.

SEND_PAR(DATA)

The SEND_PAR(DATA) command is a parameter setting command that is executed by the processor 102 after which the processor 102 moves to the next basic command to be executed. The SEND_PAR command causes the processor 102 to set the PAR_TYPE line High and the COM_TYPE line High and provides data on the DATA lines to the command interpreter 106. The DATA parameter, in one embodiment, is a seven-bit binary vector, with all seven bits used in code by the command interpreter. The SEND_PAR command instructs the command interpreter 106 to set various parameters by sending meta commands to the command interpreter 106. Three exemplary types of meta commands are listed below and illustrated in FIG. 2.

A first exemplary type of meta commands associated with the SEND_PAR command is a set_val type of commands 202. The set_val commands 202 have the following configuration for the seven-bit configuration for the DATA parameter:

DATA=(set_id, com_id, val)

where setid is a two-bit identifier, which indicates the type of SEND_PAR command is being sent. In one embodiment, the set_id 204 for set_val commands 202 is 11. The com_id 206 is a four-bit identifier to indicate which value is being set. The val 208 is one bit of data to be set by the set_val command type. The following two commands are illustrative examples of set_val command types.

A first command of the set_val command type is the set_enable_on command, which sets the value of the memory enable signal EN. The com_id for the set_enable_on command is 0000. When val=1, the memory enable line is set to HIGH as is shown in command 210. When val=0, the memory enable line is set to LOW as is shown in command 212. The EN line is as is illustrated in FIG. 1, provides a signal to cause the processor 102 and memory storage device 104 to execute commands.

A second command of the set_val command type is the set_cmp_on command, which enables or disables the comparison of memory output signals. The com_id for the set_cmp_on command is 0001. When val=1, the memory comparison is enabled as is shown in command 214. When val=0, the memory comparison is disabled as is shown in command 216.

A second exemplary type of meta commands associated with the SEND_PAR command is a set_flags type of commands 220. The set_flags commands have the following configuration for the seven-bit configuration for the DATA parameter:

DATA=(set_id, sel_flags)

where the two-bit set_id 222 is illustratively designated as 10. The sel_flags 224 is a five-bit vector that is to be used in a multiplexer module inside the command interpreter 106 to select a one-bit signal for the IF status line from up to 32 internal signals. The following two commands are illustrative examples of set_val command types.

A first command of the set_flags command type 220 is the set_if_flag_to_last_adr command 226. The set_if_flag_to_last_adr command 226 selects the last_adr internal signal to be output through port IF. For the set_if_flag_to_last_adr command, the value of the sel_flags variable is set to 00001.

A second command of the set_flags command type 220 is the set_if_flag_to_last_port command 228. The set_if_flag_to_last_port commands selects the last_port internal signal to be output through port IF. For the set_if_flag_to_last_port command, sel_flags=00010.

A third exemplary type of meta commands associated with the SEND_PAR command is a set_pars type of commands 230, which provide data to set different parameters. The set_pars commands 230 have the following configuration for the seven-bit configuration for the DATA parameter:

DATA=(set_id, pars)

where the two-bit set_id 232 is illustratively designated as 00. The pars identifier 234 is a six-bit vector that can be used to set internal parameters. One example of a set_pars command is the set_oracle_par command 236, which is used to set parameters describing the phase of a memory testing algorithm. Some examples of phases in the memory testing program include an init state and a target state, which code data patterns in memory before the start of the algorithm phase and after its completion. In addition, two parameters, dimension and direction indicate the direction that the memory testing algorithm traverses memory cells during a testing program, grouping memory into rows and columns. Examples of some types of paths that the memory testing algorithms including moving upward or downward, along rows or columns, or along a snake route.

FIG. 3 illustrates an example of a testing program 300 written as C code for a March type memory test algorithm. When compiled, the program is 38 lines of nine-bit binary words. The nine bits includes the seven-bit DATA send to the command interpreter 106, plus a two-bit prefix that codes the base executable commands (such as, for example, SEND_COM, LOAD_JUMP and any of the others described above) and to control command flow. A initialization portion 302 of the testing program 300 illustratively defines arrays for use in the remainder of the program. The arrays include initial and target arrays having values for the initial and target states as well is information to determine the direction and dimension of traversal through the memory 108. Variables are assigned initial conditions for each of the initial and final states as well as the direction and dimension and passed to the command interpreter 106. In addition, the EN line is set to on and the active jump label is set.

An initial writing portion 304 of the testing program 300 assigns a label to a command that writes data to a location in memory and moves forward unless the IF line is 0. The initial writing portion 304 then sets the comparison flag on, using command 214. The label is then assigned to a command to set the enable on, using the set_enable_on command.

A loop portion 306 of the testing program 300 performs a memory test by looping five times through a testing loop. In each of the five loops, different values for the init_state, target_state, direction, and dimension are illustratively assigned from the arrays that were set up in the initialization portion 302 of the program. Once assigned, the values are passed to the command interpreter 106 using the set_oracle_par command 236. The loop portion then traverses the memory by first reading a value in a location and then writing a new value in that location, to be read during the next pass through the loop. Once the testing loop has been traversed five times, the testing program 300 changes the active port and if the last port is not reached, loops back through the loop portion to test another portion of the memory 108. If the last port has been reached, the testing program 300 exits the loop and terminates the program.

Once the testing program has been written, it is illustratively compiled and loaded into the memory storage device 104. Then, when it is advantageous to perform a memory test, a testing device such as one of the different types described above illustratively enables the processor 102 and the program is executed. It should be appreciated that the memory storage device 104 is, in one embodiment, reprogrammable, so that the execution of a testing program such as testing program 300 can be performed, the memory storage device loaded with a different testing program and that program can be subsequently executed to perform another memory test on the same or different memory locations. It should be further appreciated that the processor 102 is capable of performing parallel testing of several memory instances.

The embodiments discussed above provide several important advantages. By creating a reprogrammable memory testing device that is locatable on board an integrated circuit device, the die size for the built-in testing solution is reduced. In addition, because a variety of different tests can be performed on chip merely by loading in a different testing program as opposed to using external testing devices, the tests can be performed more quickly, due to the increased speed capable by onboard testing devices. Further, testing of memory devices is extensible due to the lack of dedicated, custom design on board. Instead, testing programs can be changed on the fly during chip testing during manufacture verification testing.

Although the present disclosure has been described with reference to various embodiments, workers skilled in the art will recognize that changes may be made in form and detail without departing from the scope of the invention.

What is claimed is:

1. A memory testing system for testing a plurality of memory locations in an electronic memory device, comprising:
    a programmable memory device integrated into said electronic memory device that receives and stores a first compiled memory testing program, and that receives and stores a second compiled memory testing program that is different from said first compiled memory testing program such that said programmable memory device is rewritten with said second compiled memory testing program;
    a processor in communication with said programmable memory device that reads and executes instructions from said first compiled testing program stored in said programmable memory device while said programmable memory device stores said first compiled memory testing program and that reads and executes instructions from said second compiled memory testing program when said programmable memory device is rewritten to store said second compiled memory testing program; and
    a command interpreter that receives data from said processor related to said first and said second compiled memory testing programs, that interprets said received data from said processor into commands to be executed during memory testing, and executes said commands to access and test memory locations in said plurality of memory locations of said electronic memory device.

2. The memory testing system of claim 1, wherein said command interpreter is communicatively connected with the plurality of memory locations.

3. The memory testing system of claim 1, wherein said first and said second compiled testing programs include executable commands from a command language and wherein said processor executes commands from said command language.

4. The memory testing system of claim 3, wherein said command language includes an executable command for sending data to said command interpreter.

5. The memory testing system of claim 4, wherein said data sent to said command interpreter, when interpreted, causes said command interpreter to write data to at least one of said plurality of memory locations.

6. The memory testing system of claim 4, wherein said data sent to said command interpreter, when interpreted, causes said command interpreter to read data from at least one of said plurality of memory locations.

7. The memory testing system of claim 4, wherein said command interpreter includes at least one parameter and wherein said data sent to said command interpreter, when interpreted, causes said command interpreter to assign a value to said at least one parameter.

8. The memory testing system of claim 3 wherein said command language comprises an instruction set including at least one command that, when executed, provides instruction to said command interpreter to access at least one memory location of said plurality of memory locations.

9. An integrated circuit comprising said programmable memory device of said memory testing system of claim 1.

10. The integrated circuit of claim 9 further comprising said processor.

11. The integrated circuit of claim 10 further comprising said command interpreter.

12. The integrated circuit of claim 9 further comprising said plurality of memory locations to be tested.

13. A method of testing a plurality of memory locations in an electronic memory device located on an integrated circuit, comprising:
    preparing and compiling a first memory testing algorithm that, when executed, accesses at least one of said plurality of memory locations in said electronic memory device;
    storing said first compiled memory testing algorithm on a programmable tangible storage medium located on said integrated circuit;
    accessing said first compiled memory testing algorithm with a processor that is in communication with said programmable tangible storage medium storing said first compiled memory testing algorithm;
    executing said first memory testing algorithm to test said plurality of memory locations;
    preparing and compiling a second memory testing algorithm that, when executed, accesses at least one of said plurality of memory locations in said electronic memory device and is different than said first memory testing algorithm;
    storing said second compiled memory testing algorithm on said programmable tangible storage medium located on said integrated circuit such that said programmable storage medium is rewritten with said second compiled memory testing algorithm;
    accessing said second compiled memory testing algorithm with said processor that is in communication with said programmable tangible storage medium now storing said second compiled memory testing algorithm; and
    executing said second memory testing algorithm to test said plurality of memory locations with said second memory testing algorithm.

14. The method of claim 13, wherein said preparing and compiling said first and said second memory testing algorithms includes utilizing a command language that includes commands dedicated to accessing memory locations in a memory testing application.

15. The method of claim 13, wherein said executing said first and said second memory testing algorithms includes sending data related to accessing memory locations from said processor to a command interpreter such that said command interpreter interprets said data related to accessing memory locations from said processor into commands to be executed during memory testing and executes said commands to access and test said memory locations in said plurality of memory locations of said memory device.

16. The method of claim 15, wherein said sending data related to accessing said memory locations from said processor to said command interpreter includes instructing said command interpreter to read data from said memory locations.

17. The method of claim 15, wherein said sending data related to accessing said memory locations from said processor to said command interpreter includes instructing said command interpreter to write data to said memory locations.

18. The method of claim 15, wherein said sending data to said command interpreter includes sending said data to a command interpreter located external to said electronic memory device.

* * * * *